United States Patent
Sobolewski et al.

[11] Patent Number: 5,994,947
[45] Date of Patent: Nov. 30, 1999

[54] LOW LEAKAGE SOLID STATE SWITCH

[75] Inventors: Gregory Sobolewski, Seven Hills; John G. Banaska, North Royalton, both of Ohio

[73] Assignee: Keithley Instruments, Inc., Cleveland, Ohio

[21] Appl. No.: 09/039,045

[22] Filed: Mar. 13, 1998

[51] Int. Cl.⁶ .................................................. H03K 17/62
[52] U.S. Cl. ........................ 327/403; 327/561; 327/379
[58] Field of Search ..................................... 327/403, 404, 327/309, 312, 313, 314, 316, 323, 332, 560–563, 362, 363, 307, 379, 384, 389

[56] References Cited

U.S. PATENT DOCUMENTS

| | | | |
|---|---|---|---|
| 3,755,750 | 8/1973 | Heberling | 327/558 |
| 4,279,745 | 7/1981 | Haase | 327/552 |
| 4,323,798 | 4/1982 | Watkins | 327/561 |
| 4,341,962 | 7/1982 | Buff | 327/352 |
| 5,039,934 | 8/1991 | Banaska | 323/268 |
| 5,552,739 | 9/1996 | Keeth et al. | 327/538 |
| 5,578,958 | 11/1996 | Yasuda | 327/350 |
| 5,886,570 | 3/1999 | Brokaw | 327/563 |

*Primary Examiner*—Toan Tran
*Attorney, Agent, or Firm*—Pearne, Gordon, McCoy & Granger LLP

[57] ABSTRACT

A low leakage solid state switch for range-changing uses a pair of low leakage diodes switched to a reference voltage to block leakage through the switch when it is in the "off" state.

4 Claims, 1 Drawing Sheet

LOW LEAKAGE SOLID STATE SWITCH

BACKGROUND OF THE INVENTION

The present invention relates to low leakage solid state switches and, in particular, to solid state switches used in range-changing networks in electrical measurement devices.

Referring to FIG. 1, a typical range-changing circuit for a high impedance and/or low current, current measurement device is generally indicated by the numeral 10.

The noninverting input of the operational amplifier 12 is connected to a reference potential for the measurement (i.e., the measurements on a device under test are made with respect to $V_F$). The inverting input of the amplifier 12 is connected to a test point on the device under test. In order to appropriately scale the input current from the test point, a range-changing network is provided between the output of the amplifier 12 and the inverting input of the amplifier 12. The range-changing network includes a series of parallel branches, each including a switch and a range impedance. For example, the switches 14, 16, 18 are each located in a range-changing network branch having a range impedance 20, 22, 24, respectively. The switches 14, 16, 18 may be, for example, reed relays. The range impedances 20, 22, 24 may be, for example, 2 GΩ, 20 GΩ, 200 GΩ, respectively. To select a range, one of the switches 14, 16, 18 is turned "on" and the rest turned "off".

It should also be noted that the feedback from the output of the amplifier 12 through the range-changing network forces the inverting input of the amplifier 12 to $V_F$.

Ideally, the switches 14, 16, 18 have infinite impedance when they are "off" and zero impedance when they are "on". It is possible to closely approximate this ideal behavior with reed relays.

However, reed relays are expensive, take up substantial space and provide a source of mechanical failures. Solid state switches can be smaller, cheaper and more reliable. Unfortunately, prior art solid state switches tend to be leaky when they are "off". As a result, they have not been suitable where measurements on the order of 10 picoamperes or less are desired.

SUMMARY OF THE INVENTION

A low leakage switch having a first terminal and a second terminal, the second terminal being at a potential corresponding to a reference potential, includes a first operational amplifier having a noninverting input, an inverting input, and an output; a first solid state switching element having an input, and an output; a second solid state switching element having an input, and an output; a leakage stop having an input and an output; a second operational amplifier having a noninverting input, an inverting input, and an output; and a third solid state switching element having an input, and an output. The first operational amplifier noninverting input is the first terminal. The first operational amplifier output communicates with the first switching element input. The first switching element output communicates with the second switching element input and the leakage stop input. The second switching element output is at a potential corresponding to the reference potential. The second operational amplifier noninverting input communicates with the leakage stop output and the second terminal. The second operational amplifier inverting input communicates with the second operational amplifier output. The second operational amplifier output communicates with the third switching element input. The third switching element output communicates with the first operational amplifier inverting input. When the first and third switching elements are "off" and the second switching element is "on" the low leakage switch is "off", and when the first and third switching elements are "on" and the second switching element is "off", the low leakage switch is "on".

DESCRIPTION OF THE PREFERRED EMBODIMENTS

Figure 1:
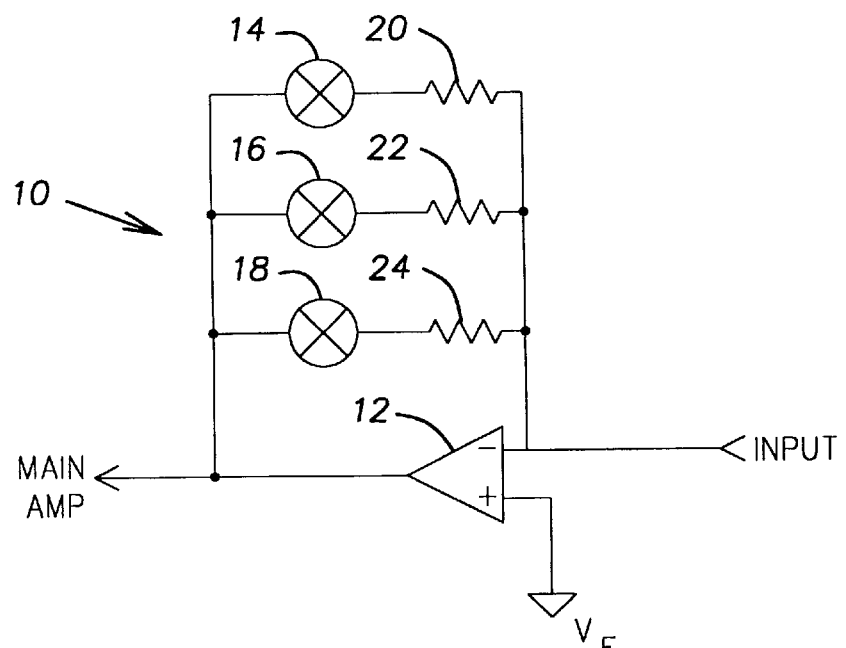
FIG. 1 is a schematic diagram of a prior art range-changing circuit.
Figure 2:
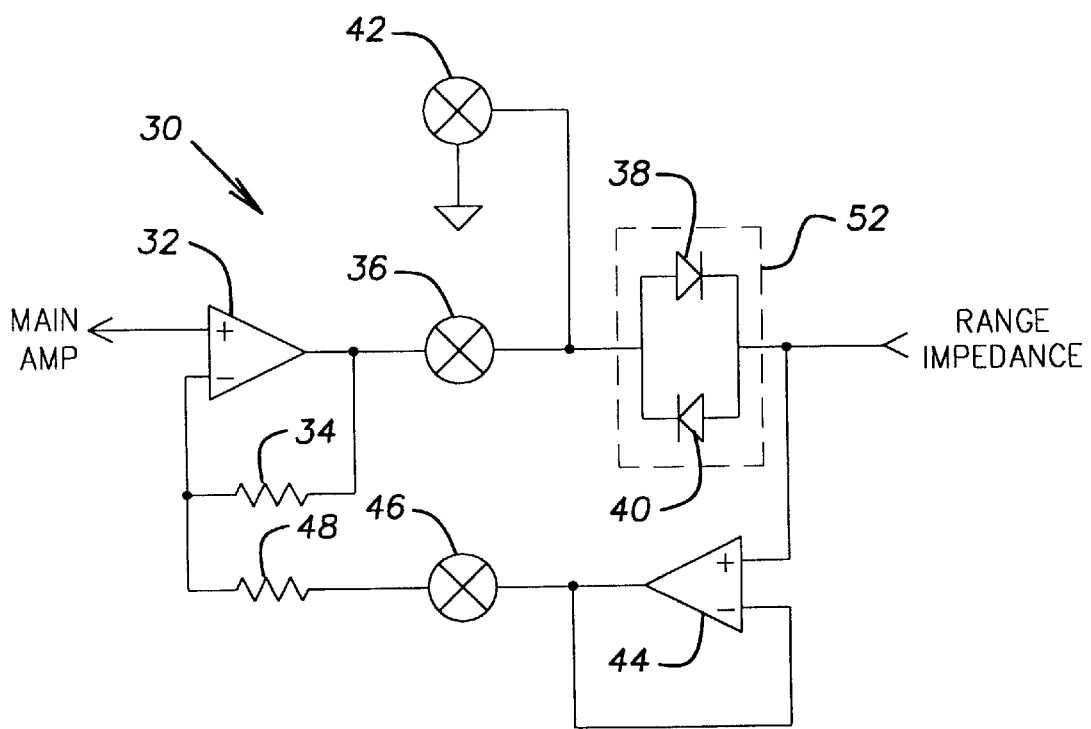
FIG. 2 is a schematic diagram of a solid state switch according to the invention.

Referring to FIG. 2, a solid state switch 30 is suitable for use as a switch 14, 16, 18 of FIG. 1. The noninverting input of an operational amplifier 32 is connected to the main amplifier (not shown) of a measurement device. The output of the amplifier 32 is connected to one terminal of a resistor 34 and the input of a switch 36. The other terminal of the resistor 34 is connected to the inverting input of the amplifier 32. The output of the switch 36 is connected to the input of a solid state leakage stop 52 and the input of a switch 42. The output of the switch 42 is connected to $V_F$. The output of the leakage stop 52 is connected to the noninverting input of an operational amplifier 44 and is connectable to a respective range impedance of FIG. 1.

The inverting input of the amplifier 44 is connected to the output of the amplifier 44. The output of the amplifier 44 is connected to the input of a switch 46. The output of the switch 46 is connected to one terminal of a resistor 48. The other terminal of the resistor 48 is connected to the inverting input of the amplifier 32 and the resistor 34.

The switches 36, 42, 46 may be various solid state switching elements, for example, field effect transistors. The control inputs for the switches 36, 42, 46 are not shown, but in operation of the solid state switch 30, are applied to turn the switches 36, 42, 46 "on" or "off" as described below.

The solid state leakage stop 52 is characterized by having essentially zero current leakage for voltages across it that are at or near zero, for example, 1 femtoampere, or less, at 1 millivolt. At higher voltages (e.g., 0.5 volts), the leakage stop 52 should present little or no obstacle to current.

A possible embodiment of the leakage stop 52 is illustrated in the form of diodes 38, 40. The output of the switch 36 is connected to the anode of a diode 38, the cathode of a diode 40 and the input of a switch 42. The cathode of the diode 38 and the anode of the diode 40 are connected to the noninverting input of the operational amplifier 44 and are connectable to a respective range impedance of FIG. 1. The diodes 38, 40 are very low leakage diodes. They have essentially zero leakage at or near zero volts (e.g., less than 1 femtoamperes at 1 millivolt).

The leakage stop 52 also may be formed from any other suitable solid state device, such as a low-leakage MOSFET connected to provide low leakage at, or near, zero volts and conduction otherwise.

When the solid state switch 30 is "off", the switches 36, 46 are "off" and the switch 42 is "on". As mentioned above, the range impedance is connected to an input that is always forced to $V_F$ (FIG. 1). The switch 42 being "on" connects the leakage stop 52 (the diodes 38, 40) to $V_F$. As a result, the leakage stop 52 (the diodes 38, 40) has a zero potential across it and therefore zero leakage current through it, despite the fact that the switch 36 may be far from an infinite impedance when "off". The amplifier 44 provides the only other path for current through the range impedance, but in a high impedance operational amplifier, this bias current can be limited to be less than 10 femtoamperes. Thus the switch 30 has less than 10 femtoamperes leakage in the "off" state.

The resistor 34 (e.g., 10 MΩ) provides DC feedback for the amplifier 32 when the switch 46 is open.

When the solid state switch 30 is "on", the switches 36, 46 are "on" and the switch 42 is "off". In this case, the feedback loop through the amplifier 44 back to the amplifier 32 forces the voltage at the range impedance to be equal to the voltage at the main amplifier terminal. The resistor 48 may be, for example, 1 KΩ and is selected in conjunction with the resistor 34 to provide enough closed loop gain to reduce the effective voltage drop across the leakage stop 52 to a negligible value.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed is:

1. A low leakage switch having a first terminal and a second terminal, said second terminal being at a potential corresponding to a reference potential, comprising:

a first operational amplifier having a noninverting input, an inverting input, and an output;

a first solid state switching element having an input, and an output;

a second solid state switching element having an input, and an output;

a leakage stop having an input and an output;

a second operational amplifier having a noninverting input, an inverting input, and an output; and a third solid state switching element having an input, and an output, wherein said first operational amplifier noninverting input is said first terminal; said first operational amplifier output communicates with said first switching element input; said first switching element output communicates with said second switching element input and said leakage stop input; said second switching element output being at a potential corresponding to said reference potential, said second operational amplifier noninverting input communicates with said leakage stop output, and said second terminal; said second operational amplifier inverting input communicates with said second operational amplifier output; said second operational amplifier output communicates with said third switching element input; and said third switching element output communicates with said first operational amplifier inverting input, whereby when said first and third switching elements are "off" and said second switching element is "on" said low leakage switch is "off", and when said first and third switching elements are "on" and said second switching element is "off", said low leakage switch is "on".

2. A low leakage switch having a first terminal and a second terminal, said second terminal being at a potential corresponding to a reference potential, comprising:

a first operational amplifier having a noninverting input, an inverting input, and an output;

a first solid state switching element having an input, and an output;

a second solid state switching element having an input, and an output;

a first diode having an anode and a cathode;

a second diode having an anode and a cathode;

a second operational amplifier having a noninverting input, an inverting input, and an output; and a third solid state switching element having an input, and an output, wherein said first operational amplifier noninverting input is said first terminal; said first operational amplifier output communicates with said first switching element input; said first switching element output communicates with said second switching element input, said first diode anode, and said second diode cathode; said second switching element output being at a potential corresponding to said reference potential, said second operational amplifier noninverting input communicates with said first diode cathode, said second diode anode, and said second terminal; said second operational amplifier inverting input communicates with said second operational amplifier output; said second operational amplifier output communicates with said third switching element input; and said third switching element output communicates with said first operational amplifier inverting input, whereby when said first and third switching elements are "off" and said second switching element is "on" said low leakage switch is "off", and when said first and third switching elements are "on" and said second switching element is "off", said low leakage switch is "on".

3. A range-changing network branch comprising a low leakage switch having a first terminal and a second terminal, and a range impedance having a first terminal and a second terminal, said low leakage switch second terminal being connected to said range impedance first terminal and said range impedance second terminal communicating with an input to said range-changing network, said low leakage switch including:

a first operational amplifier having a noninverting input, an inverting input, and an output;

a first solid state switching element having an input, and an output;

a second solid state switching element having an input, and an output;

a leakage stop having an input and an output;

a second operational amplifier having a noninverting input, an inverting input, and an output; and a third solid state switching element having an input, and an output, wherein said first operational amplifier noninverting input is said low leakage switch first terminal; said first operational amplifier output communicates with said first switching element input; said first switching element output communicates with said second switching element input and said leakage stop input; said second switching element output being at a potential corresponding to a reference potential, said second operational amplifier noninverting input communicates with said leakage stop output, and said low leakage switch second terminal; said second operational amplifier inverting input communicates with said second operational amplifier output; said second operational amplifier output communicates with said third switching element input; and said third switching element output communicates with said first operational amplifier inverting input, whereby when said first and third switching elements are "off" and said second switching element is "on" said low leakage switch is "off", and when said first and third switching elements are "on" and said second switching element is "off", said low leakage switch is "on".

4. A range-changing network branch comprising a low leakage switch having a first terminal and a second terminal, and a range impedance having a first terminal and a second terminal, said low leakage switch second terminal being connected to said range impedance first terminal and said range impedance second terminal communicating with an input to said range-changing network, said low leakage switch including:

a first operational amplifier having a noninverting input, an inverting input, and an output;

a first solid state switching element having an input, and an output;

a second solid state switching element having an input, and an output;

a first diode having an anode and a cathode;

a second diode having an anode and a cathode;

a second operational amplifier having a noninverting input, an inverting input, and an output; and a third solid state switching element having an input, and an output, wherein said first operational amplifier noninverting input is said low leakage switch first terminal; said first operational amplifier output communicates with said first switching element input; said first switching element output communicates with said second switching element input, said first diode anode, and said second diode cathode; said second switching element output being at a potential corresponding to a reference potential, said second operational amplifier noninverting input communicates with said first diode cathode, said second diode anode, and said low leakage switch second terminal; said second operational amplifier inverting input communicates with said second operational amplifier output; said second operational amplifier output communicates with said third switching element input; and said third switching element output communicates with said first operational amplifier inverting input, whereby when said first and third switching elements are "off" and said second switching element is "on" said low leakage switch is "off", and when said first and third switching elements are "on" and said second switching element is "off", said low leakage switch is "on".

* * * * *